United States Patent
McCleary et al.

(10) Patent No.: US 8,823,531 B1
(45) Date of Patent: Sep. 2, 2014

(54) SYSTEMS AND METHODS FOR SENSING AND INDICATING ORIENTATION OF ELECTRICAL EQUIPMENT WITH ACTIVE COOLING

(75) Inventors: Jacob D. McCleary, Merdianville, AL (US); Brian Smith, Madison, AL (US); Curtis W. Dodd, Huntsville, AL (US)

(73) Assignee: ADTRAN, Inc., Huntsville, AL (US)

( * ) Notice: Subject to any disclaimer, the term of this patent is extended or adjusted under 35 U.S.C. 154(b) by 284 days.

(21) Appl. No.: 13/087,099

(22) Filed: Apr. 14, 2011

(51) Int. Cl.
*G08B 21/00* (2006.01)
*H04L 5/16* (2006.01)

(52) U.S. Cl.
USPC .......................... 340/584; 165/146; 165/160

(58) Field of Classification Search
CPC ......... B21D 13/04; B21D 13/10; E04C 2/326
USPC ............. 340/584, 693.5, 693.6, 693.9, 686.1, 340/682.2, 686.6; 361/679, 703; 165/146, 165/160
See application file for complete search history.

(56) References Cited

U.S. PATENT DOCUMENTS

| | | | |
|---|---|---|---|
| 6,750,562 B2 | 6/2004 | Rolls et al. | |
| 7,135,826 B2 | 11/2006 | Ma et al. | |
| 7,209,351 B2 | 4/2007 | Wei | |
| 7,355,848 B1 | 4/2008 | Hodge et al. | |
| 7,450,382 B1 | 11/2008 | Fischer et al. | |
| 7,724,521 B2 | 5/2010 | Nelson et al. | |
| 7,855,891 B1* | 12/2010 | Ayres et al. | 361/711 |
| 2008/0040067 A1* | 2/2008 | Bashor et al. | 702/132 |
| 2009/0144568 A1* | 6/2009 | Fung | 713/300 |

OTHER PUBLICATIONS

McCleary, et al., U.S. Appl. No. 13/087,104 entitled, "Systems and Methods for Sensing and Indicating Orientation of Electrical Equipment with Passive Cooling," filed Apr. 14, 2011.

* cited by examiner

*Primary Examiner* — Brian Zimmerman
*Assistant Examiner* — Bhavin M Patel
(74) *Attorney, Agent, or Firm* — Maynard Cooper & Gale, P.C.; Jon E. Holland

(57) ABSTRACT

A system for sensing and indicating orientation of electrical equipment has an orientation sensor and control logic. The control logic is configured to compare predefined data with a sensed orientation of the electrical equipment in order to determine whether the sensed orientation of the equipment is within an acceptable range such that sufficient cooling by a cooling system is likely to occur. If the sensed orientation of the equipment is not within the acceptable range, the control logic transmits a notification signal so that corrective action can occur. As an example, the notification signal may be used to notify a user of the improper orientation. In another example, the notification signal automatically triggers an action that compensates for the improper orientation.

23 Claims, 15 Drawing Sheets

SYSTEMS AND METHODS FOR SENSING AND INDICATING ORIENTATION OF ELECTRICAL EQUIPMENT WITH ACTIVE COOLING

RELATED ART

A network access device (NAD), such as a digital subscriber line access multiplexer (DSLAM), typically has circuitry located within an enclosure of the NAD. Such circuitry can produce a relatively large amount of heat, which can become trapped within the NAD. If the temperature within the NAD becomes too high, components within the NAD may fail and/or the NAD may stop functioning entirely. Further, the efficiency and speed of integrated circuits typically vary with temperature, and it is desirable to prevent high temperatures within NADs in order to enhance performance and/or prevent errors.

Several methods for cooling NADs currently exist. One such method involves using a fan installed within the NAD. The fan pulls cool air in through an opening on one end of the NAD and pushes hot air out through an opening on another end of the NAD in order to induce air circulation within the NAD and maintain a desired operating temperature of the integrated circuits. A system having moving parts for actively forcing an airflow for cooling is referred to as an "active" cooling system. Another such method involves the use of a plurality of substantially parallel heat sink fins positioned on an outer surface of the NAD. The heat sink fins increase the surface area of the NAD in order to facilitate heat transfer from the NAD to the outside environment, and the cooling process is aided by natural buoyant airflow which travels vertically through the channels between the fins. A system that relies on natural convection for cooling without actively forcing airflows is referred to as a "passive" cooling system.

Despite efforts to remove heat and/or cool NADs, temperatures often reach undesired levels and/or adversely affect performance. Better techniques for controlling temperatures within NADs are generally desired.

BRIEF DESCRIPTION OF THE DRAWINGS

The present disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

Embodiments of the present disclosure generally pertain to systems and methods for sensing and indicating orientation of electrical equipment having a cooling system. A system in accordance with an exemplary embodiment of the present disclosure comprises electrical equipment, such as an NAD, having an orientation sensor configured to sense the orientation of the equipment. The system further comprises control logic configured to compare the sensed orientation with predefined data in order to determine whether the sensed orientation of the equipment is within an acceptable range such that sufficient cooling is likely to occur. If the sensed orientation of the equipment is not within the acceptable range, the control logic transmits a notification signal so that corrective action can occur. As an example, the notification signal may be used to notify a user, such as a technician of a network service provider, of the improper orientation. In another example, the notification signal automatically triggers an action that compensates for the improper orientation.

Figure 1:
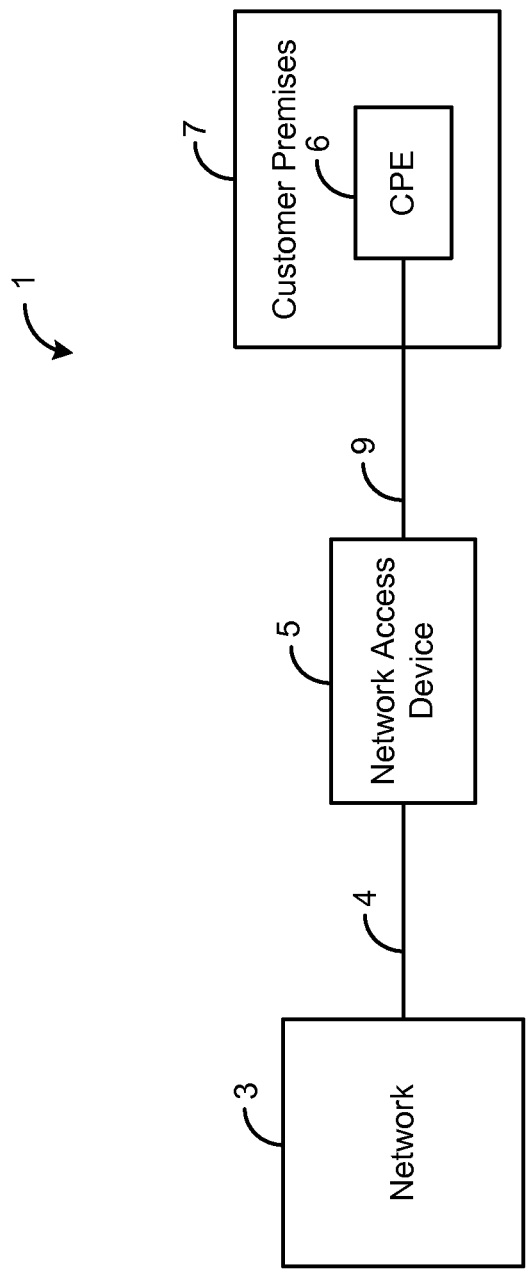
FIG. 1 is a block diagram illustrating an exemplary embodiment of a communication system.

FIG. 1 depicts an exemplary embodiment of a communication system 1 comprising a network 3, such as the public switched telephone network (PSTN) or some other telecommunication network. Access to the network 3 is provided by a network access device (NAD) 5, such as a digital subscriber line access multiplexer (DSLAM). In this regard, the NAD 5 is coupled to the network 3 via a network connection 4, and the NAD 5 is coupled to customer premises equipment (CPE) 6 at a customer premises 7 via a subscriber line 9, such as at least one twisted-wire pair, coaxial cable, or optical fiber. The NAD 5 is configured to communicate with the CPE 6 across the subscriber line 9 and with the network 3 across the network connection 4. In one exemplary embodiment, digital subscriber line (DSL) modulation formats are used for the communication, but other types of formats and protocols may be used in other embodiments.

Figure 2:
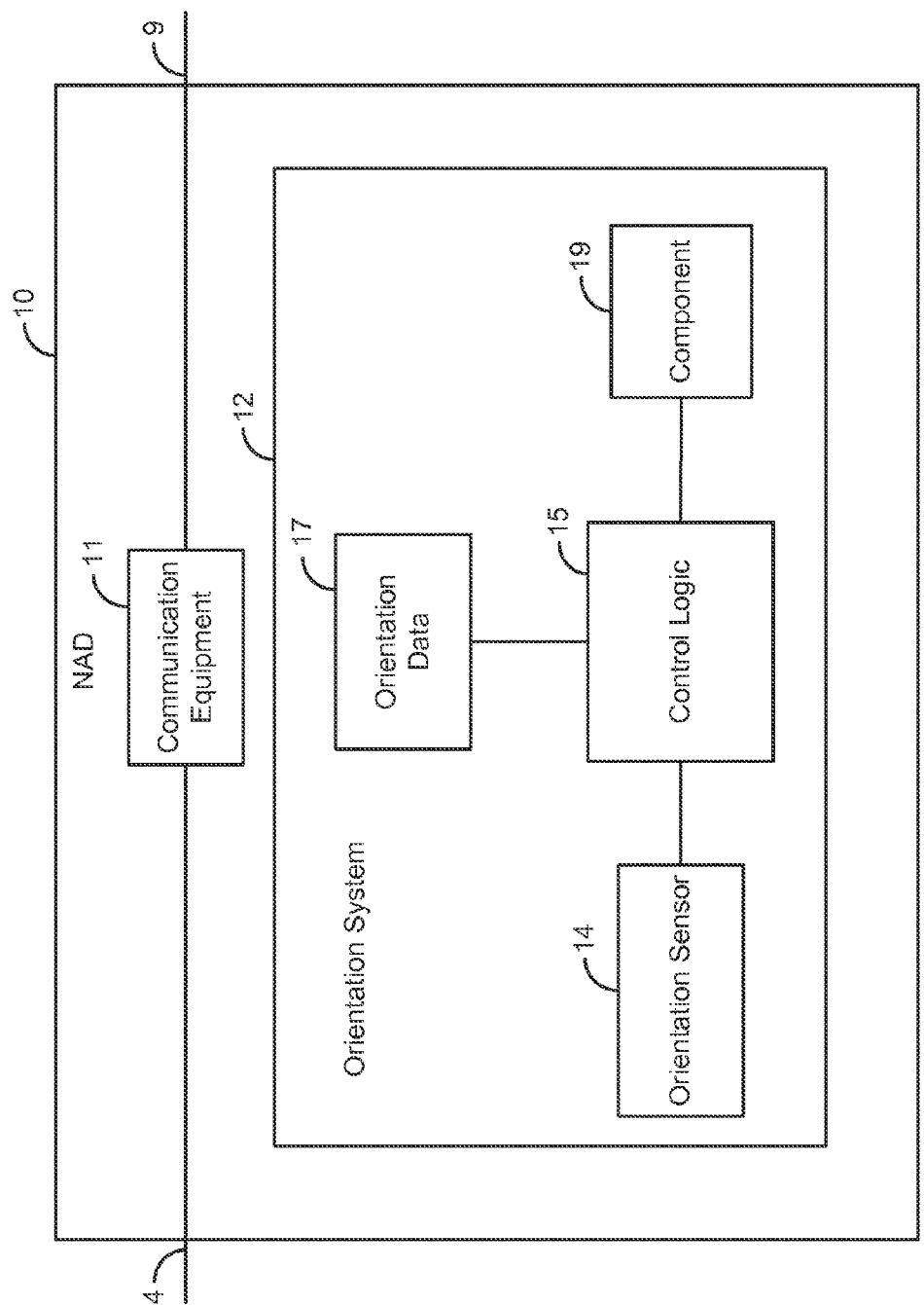
FIG. 2 is a block diagram depicting an exemplary embodiment of a network access device (NAD), such as is depicted by FIG. 1.

FIG. 2 depicts an exemplary embodiment of the NAD 10. As shown by FIG. 2, the NAD 10 comprises communication equipment 11 for communicating across the network connection 4 and the subscriber line 9. The communication equipment 11 may comprises switches, transceivers, multiplexers, and/or other components that are typically used in network communication.

The NAD 10 also comprises an orientation system 12 positioned on or within an enclosure (not shown in FIG. 2) of the NAD 10. The orientation system 12 comprises at least one orientation sensor 14 for detecting the orientation of the NAD 10 and providing orientation information indicative of such orientation. In one embodiment, the orientation sensor 14 comprises a tilt sensor, although other types of orientation sensors 14 are possible in other embodiments.

The orientation system 12 further comprises control logic 15 configured to compare the orientation information to predefined data 17, referred to hereafter as "orientation data." The orientation data 17 indicates an acceptable range of positions in which the NAD 10 may be oriented to facilitate cooling of the NAD 10. For example, in one embodiment, the orientation data 17 may indicate a threshold angle value indicative of an acceptable amount of tilt from vertical for which the NAD 10 may be properly mounted in order to allow a sufficient amount of heat to escape the NAD 10. In one embodiment, such threshold angle is approximately 15-20 degrees from vertical, although other threshold angles are possible in other embodiments. The control logic 15 is further configured to transmit a notification signal that indicates when the orientation of the NAD 10 is outside the acceptable range defined by the orientation data 17. Thus, if the orientation information indicates that the orientation of the NAD 10 is outside the acceptable range defined by the orientation data 17, the control logic 15 transmits a notification signal indicating that the NAD 10 is improperly oriented.

Figure 3:
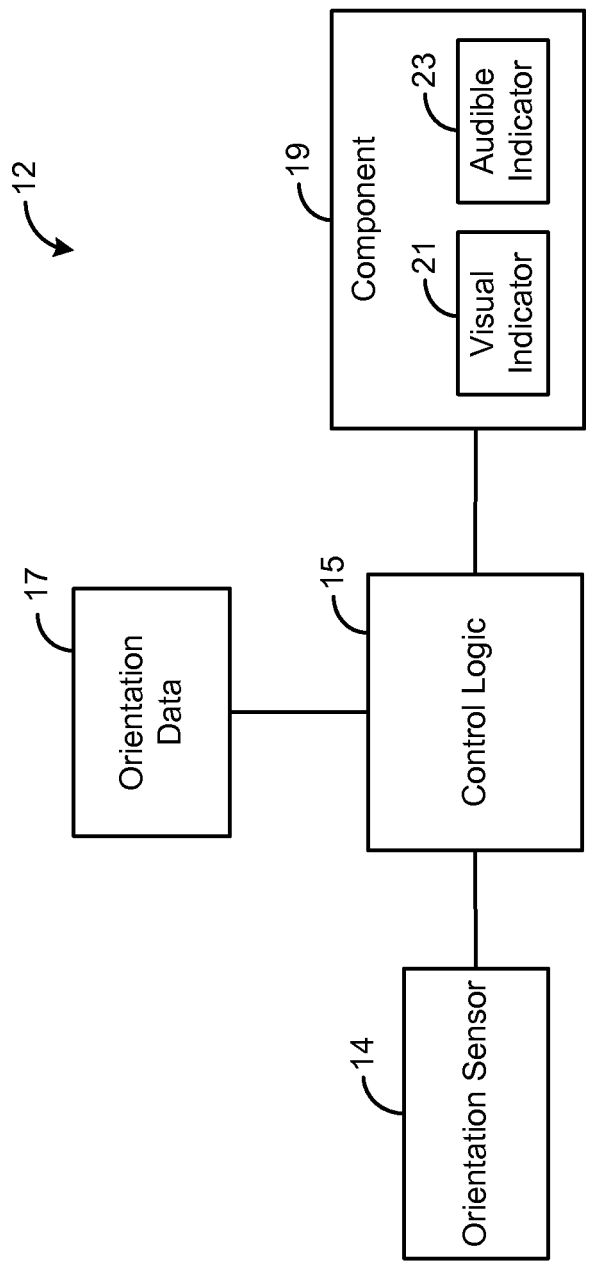
FIG. 3 is a block diagram depicting an exemplary embodiment of an orientation system, such as is depicted by FIG. 2.

The orientation system 12 further comprises at least one component 19 for receiving the notification signal. The control logic 15 transmits the notification signal to the component 19 of the orientation system 12 in order for corrective action to occur. In one embodiment, as shown by FIG. 3, the component 19 comprises a visual indicator 21, such as a light-emitting diode (LED), and/or an audible indicator 23, such as a speaker, for notifying a user of such improper orientation. As an example, the visual indicator 21 may emit light and/or a visual warning message when improper orientation is detected in order to warn a user of the improper orientation. Similarly, the audible indicator 23 may emit warning tones, an audio message, or other sound when improper orientation is detected in order to warn a user of the improper orientation. In such embodiments, a user may adjust the orientation of the NAD 10 in response to a visual or audio indication by the component 19 in an effort to correct the NAD's orientation.

Figure 4:
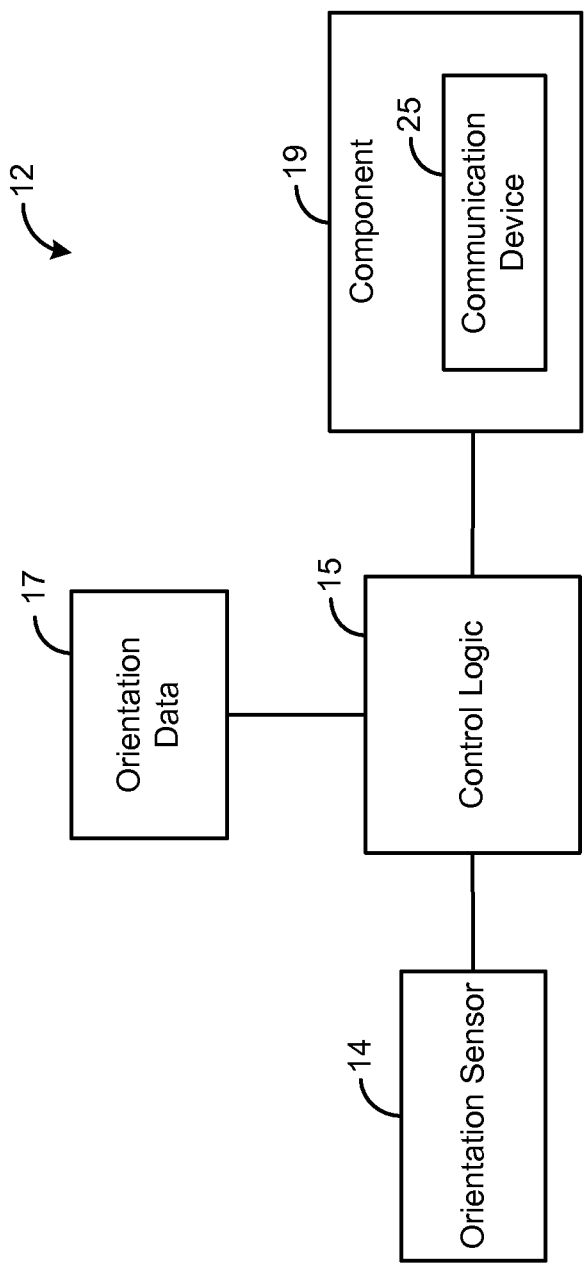
FIG. 4 is a block diagram depicting an exemplary embodiment of an orientation system, such as is depicted by FIG. 2.

In another embodiment, as shown by FIG. 4, the component 19 comprises a communication device 25, such as a modem, a radio frequency (RF) transmitter, or a cellular communication device, that is used to transmit a warning message for warning at least one user about an improper orientation sensed by the system 12. As an example, in response to an improper orientation detection, the communication device 25 may transmit a warning message (e.g., an email or text message) through the network 3 (FIG. 1) or other communication network to warn a network service provider or other user about the improper enclosure orientation.

Figure 5:
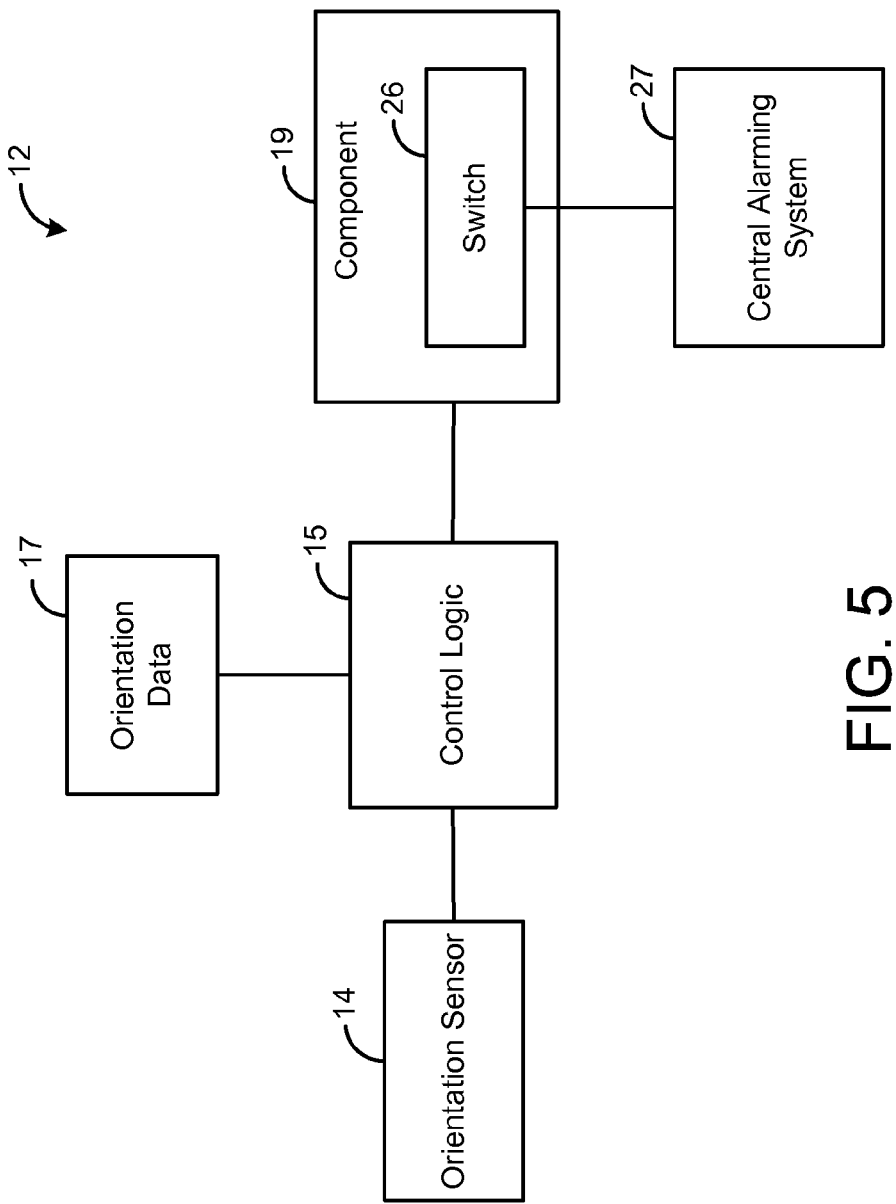
FIG. 5 is a block diagram depicting an exemplary embodiment of an orientation system, such as is depicted by FIG. 2.

In another embodiment, as shown by FIG. 5, the component comprises a switch 26, such as a relay, that is coupled to a central alarming system 27. When improper enclosure orientation is detected, the state of the switch 27 is changed (e.g., the switched is closed). Such change in state is sensed by the central alarming system 27, which then provides a warning indication, such as displaying a visual message or emitting an audible alarm.

In yet another embodiment, the component 19 may comprise a fan 45 (FIG. 14), which is activated or otherwise controlled in an effort to compensate for the effects of the improper orientation to the designed cooling of the NAD 10. In such embodiment, corrective action may occur automatically without necessarily notifying any user. Note that the NAD 10 may comprise other components and/or combination of components for responding to the notification signal from the control logic 15 in other embodiments.

Figure 6:
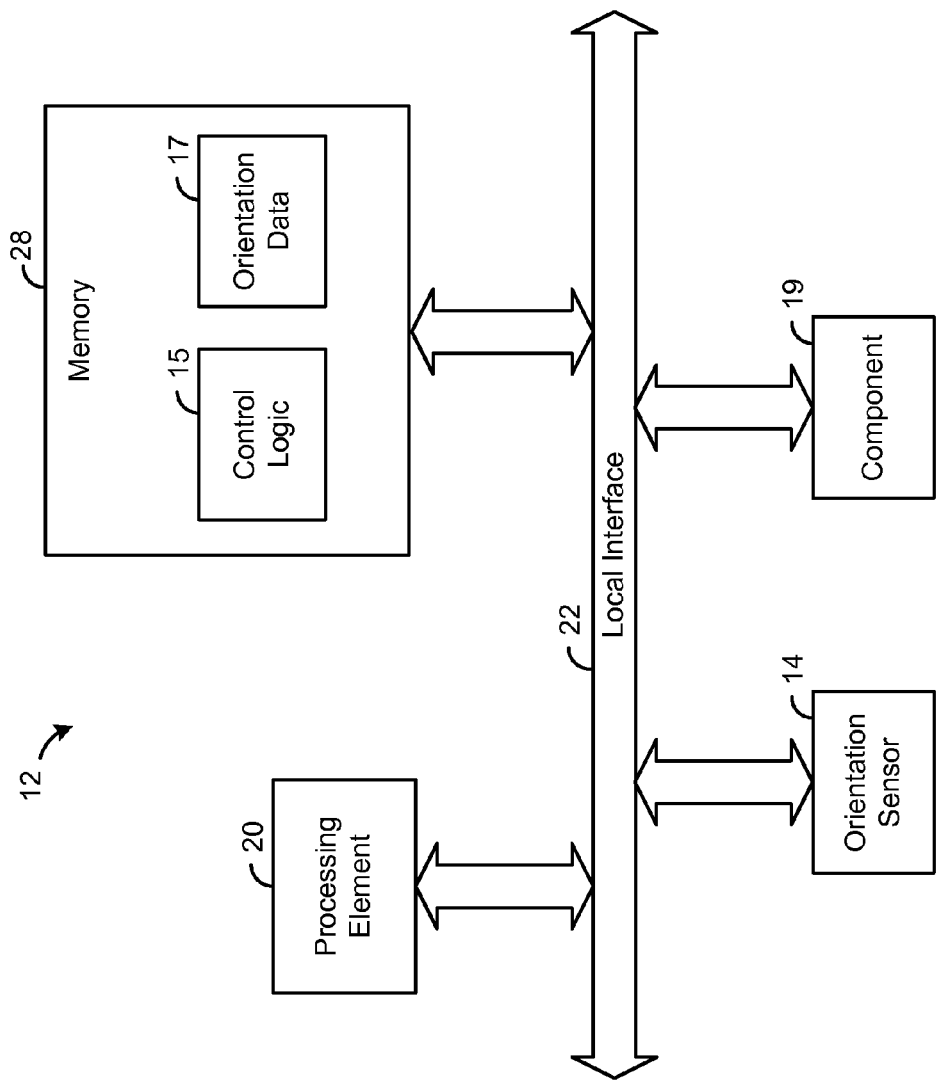
FIG. 6 is a block diagram illustrating an exemplary embodiment of an orientation system, such as is depicted by FIG. 2.

FIG. 6 depicts an exemplary embodiment of an orientation system 12. The orientation system 12 comprises at least one conventional processing element 20, such as a central processing unit (CPU) or digital signal processor (DSP), that communicates to and drives the other elements within the system 12 via a local interface 22. Furthermore, an orientation sensor 14, such as a tilt sensor, is used to provide orientation information about the NAD 10 to the control logic 15. Also, a component 19 is used to take some action in response to a notification of an improper orientation for the NAD 10. In one embodiment, the component 19 comprises a visual indicator 21 (FIG. 3) for indicating an improper orientation of the NAD 10, although other types of components are possible in other embodiments.

The control logic 15 is configured to receive orientation information from the orientation sensor 14 and compare the orientation information to the orientation data 17. As set forth above, in one embodiment, the orientation data 17 indicates an acceptable range of positions in which the NAD 10 can be installed. The control logic 15 is further configured to control the component 19 based on the comparison between the orientation information and the orientation data 17. In this regard, the control logic 15 asserts a notification signal transmitted to the component 19 when the logic 15 determines that the orientation of the NAD 10 is outside of an acceptable range indicated by the orientation data 17. Further, the acceptable range is defined such that sufficient cooling of the NAD 10, according to the design of the NAD manufacturer, is not significantly hampered or prevented due to the position of the NAD 10 when the sensed orientation is within the acceptable range. By asserting the notification signal transmitted to the component 19, the control logic 15 triggers a corrective action for the improper orientation. For example, in one embodiment, the component 19 notifies a user of the improper orientation of the NAD 10, and the user may re-orient the NAD 10 in response to such notification. It should be noted that the control logic 15 can be implemented in hardware, software, firmware, or any combination thereof. In the exemplary embodiment illustrated in FIG. 6, the control logic 15 is implemented in software and stored in memory 28 of the NAD 10 for execution by the processing element 20.

Note that the control logic 15, when implemented in software, can be stored and transported on any computer-readable medium for use by or in connection with an instruction execution apparatus that can fetch and execute instructions. In the context of this document, a "computer-readable medium" can be any means that can contain or store a computer program for use by or in connection with an instruction execution apparatus.

Figure 7:
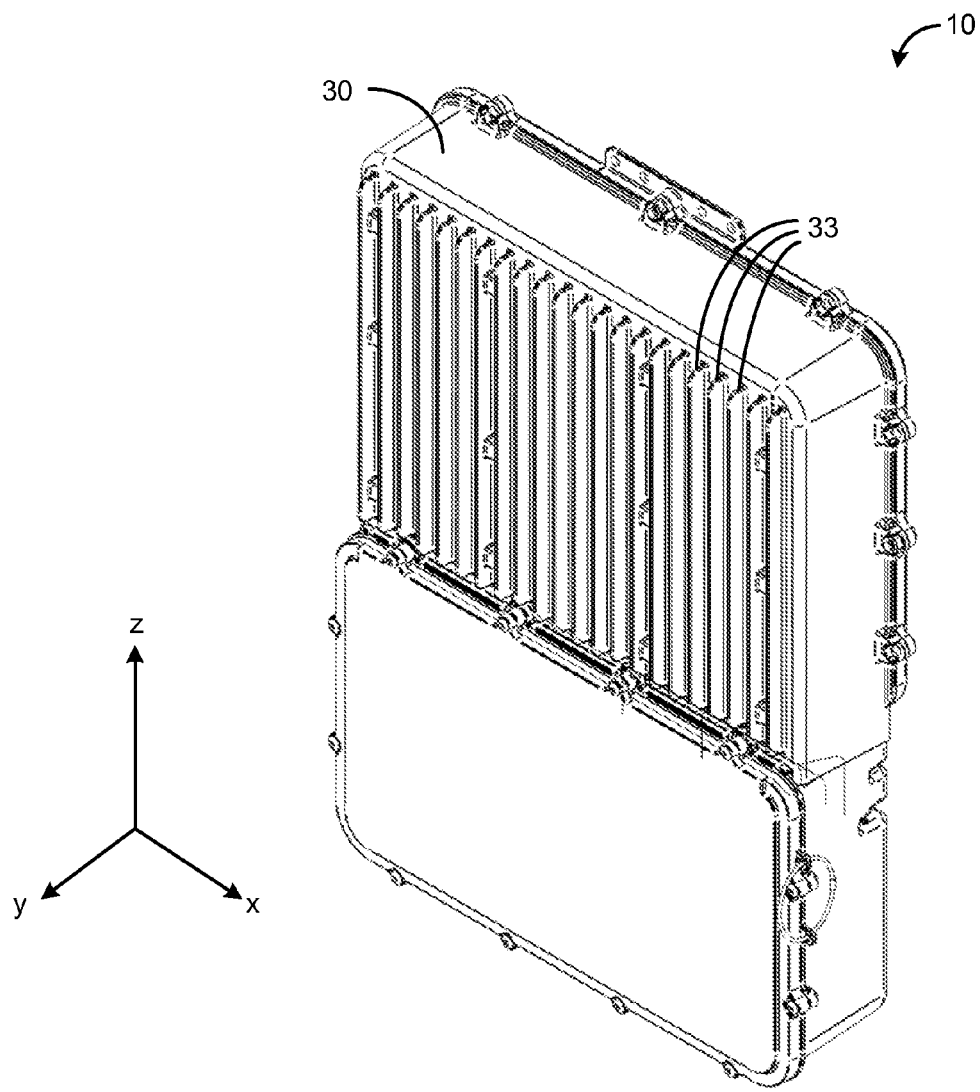
FIG. 7 depicts an exemplary embodiment of an NAD, such as is depicted by FIG. 2.

FIG. 7 depicts an exemplary embodiment of an NAD 10. As shown by FIG. 7, the NAD 10 comprises an environmentally-hardened enclosure 30 for enabling the NAD 10 to be positioned in an outside plant environment. The enclosure 30 protects telecommunication equipment, such as, for example, switches, DSLAMs, or other equipment positioned within the enclosure 30. In one embodiment, the enclosure 30 comprises a thermally conductive material, such as aluminum, although other types of materials are possible in other embodiments. The enclosure 30 is sealed in order to prevent water from entering the enclosure 30 and damaging components of the NAD 10. Furthermore, the enclosure serves as a heat sink to help remove heat from the interior of the enclosure 30. In this regard, the enclosure 30 is coupled to components, such as integrated circuits, within the enclosure 30, and when such components produce heat, the heat is transferred to the enclosure 30 to be released to the environment. Releasing heat in a relatively efficient manner is generally desirable to prevent overheating of the components within the enclosure 30.

The NAD 10 further comprises a plurality of heat sink fins 33 positioned on an outer surface of the enclosure 30. The fins 33 increase the surface area of the enclosure 30 thereby allowing a greater amount of heat to be transferred from the enclosure 30 to the environment. Furthermore, the fins 33 are oriented substantially vertical such that a longitudinal axis of each fin 33 is substantially parallel to the positive z-axis, which is parallel to gravity and, therefore, parallel to the direction of buoyant airflow, as will be described below. As used herein, a longitudinal axis of a fin 33 is the axis that runs along the greatest length of the fin 33.

Such substantially vertical orientation for the fins 33 is significant due to the buoyancy of heated air. In this regard, it is generally well known that hot air is less dense than cool air, and hot air therefore tends to rise in the direction opposite of gravity (i.e., the vertical or positive z-direction). Accordingly, as the surrounding air is heated by the enclosure 30, the heated air flows between the fins 33 in the positive z-direction. By being substantially parallel to the direction of air flow, the fins 33 do not impede the airflow but rather form channels 36 (FIG. 8) that allow the heated air to flow in the positive z-direction thereby enabling greater heat dissipation and more efficient cooling of the NAD 10. In this regard, the heated air flows unimpeded out of the channels 36 at the top of the enclosure 30 allowing the heat to efficiently dissipate to the atmosphere. The NAD 10 depicted in FIG. 7 constitutes a passive cooling system since the flow of heated air is induced by natural forces and, thus, is not driven by moving parts, such as a fan.

Figure 8:
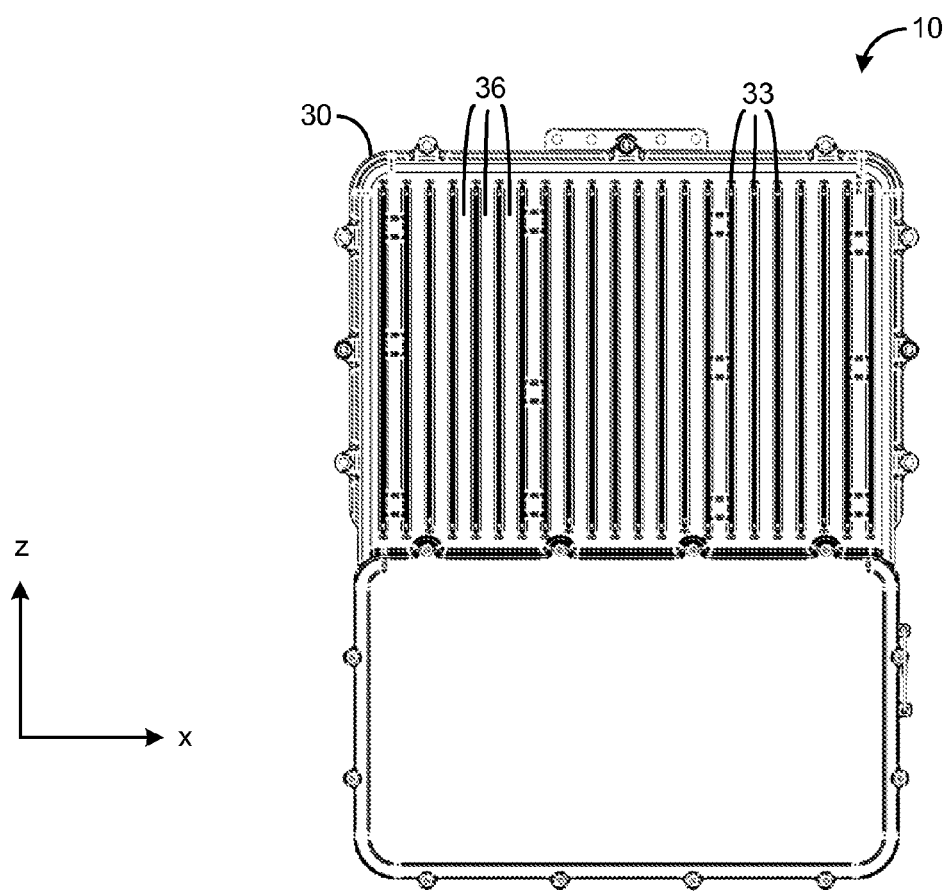
FIG. 8 depicts the NAD of FIG. 7 when the NAD is oriented properly.

Note that FIG. 8 shows a front view of the enclosure 30 depicted by FIG. 7. The enclosure 30 also has fins 33 similarly situated on the back of the enclosure 30 so that heated air may similarly flow in the positive z-direction along the back of the enclosure 30. Not only do the fins 33 increase the surface area of the enclosure 30 thereby increasing the rate of heat transfer from the enclosure 30, but they also help ensure a spacing that allows air to flow in the channels 36. For example, if the front or back of the enclosure 30 is mounted on a wall or other object, the fins 33 prevent the enclosure from being mounted such that the wall or other object is flush with the top or bottom surface on which the fins are positioned. In particular, when the fins 33 contact the wall or other object, heated air may flow through the channels 36 formed by the fins 33.

The term "substantially" vertical or "substantially" parallel to the positive z-axis recognizes that small angles of the fins 33 relative to the positive z-axis are possible without having a pronounced effect on the rate of heat dissipation from the NAD 10. As the fins 33 are orientated a greater angle from the positive z-axis, buoyant airflow is generally impeded to a greater extent thereby reducing the heat transfer rate of the enclosure 30. In this regard, a slower rate of airflow between fins 33 generally decreases the rate at which heat is carried out of such area, thereby decreasing heat transfer from the enclosure 30 to the surrounding environment. Thus, orienting the fins 33 such that they are not substantially parallel to the positive z-direction results in higher temperatures within the enclosure 30 and adversely affects the performance and life expectancy of the electrical components within the enclosure 30.

As described above, the NAD 10 comprises the orientation system 12 (FIG. 2) positioned within the enclosure 30. The orientation sensor 14 (FIG. 2) of such system 12 detects the orientation of the NAD 10, and the control logic 15 (FIG. 2) compares the orientation information from the sensor 14 to the orientation data 17 (FIG. 2) to determine whether the NAD 10 is oriented properly. For example, based on the orientation information detected by the orientation sensor 14, the control logic 15 determines whether the NAD 10 is oriented such that the longitudinal axes of the heat sink fins 33 are positioned substantially parallel to the positive z-direction thereby allowing air to flow unimpeded between the fins 33 and dissipate more heat. If the orientation information indicates that the fins 33 are not oriented substantially parallel to the z-direction or within an acceptable range of deviation from the z-direction, the control logic 15 asserts a notification signal transmitted to the component 19 (FIG. 2) indicating that the orientation of the enclosure 30 is deemed to be improper.

Note that there are a variety of sensor types and techniques that can be used to determine the orientation of the enclosure 30. In one exemplary embodiment, tilt sensors are used to implement the orientation sensor 14. As known in the art, a tilt sensor measures a degree of tilt from a reference. At least one tilt sensor is used to measure a degree of tilt about the x-axis, at least one tilt sensor is used to measure a degree of tilt about the y-axis, and at least one tilt sensor is used to measure a degree of tilt about the z-axis. Further, the orientation data 17 indicates the range of tilt measurements for each axis that are deemed to be acceptable for a proper orientation. If the tilt measured by any of the sensors is outside of the acceptable range indicated by the orientation data 17, then the control logic 15 determines the orientation of the enclosure 30 to be improper. Otherwise, the control logic 15 determines the orientation of the enclosure 30 to be proper. In one exemplary embodiment, the control logic 15 allows a tilt of about 15 to 20 degrees in any-direction such that a notification signal is generated if the enclosure 30 is tilted more than about 15 to 20 degrees in any-direction from the orientation shown by FIGS. 7 and 8. However, other ranges are possible in other embodiments. Tilt or rotation about the z-axis should have no appreciable effect on cooling since the z-axis is parallel to the buoyant flow. Only tilt or rotation about the x and y-axes is likely to have a significant bearing on cooling in this example.

Figure 9:
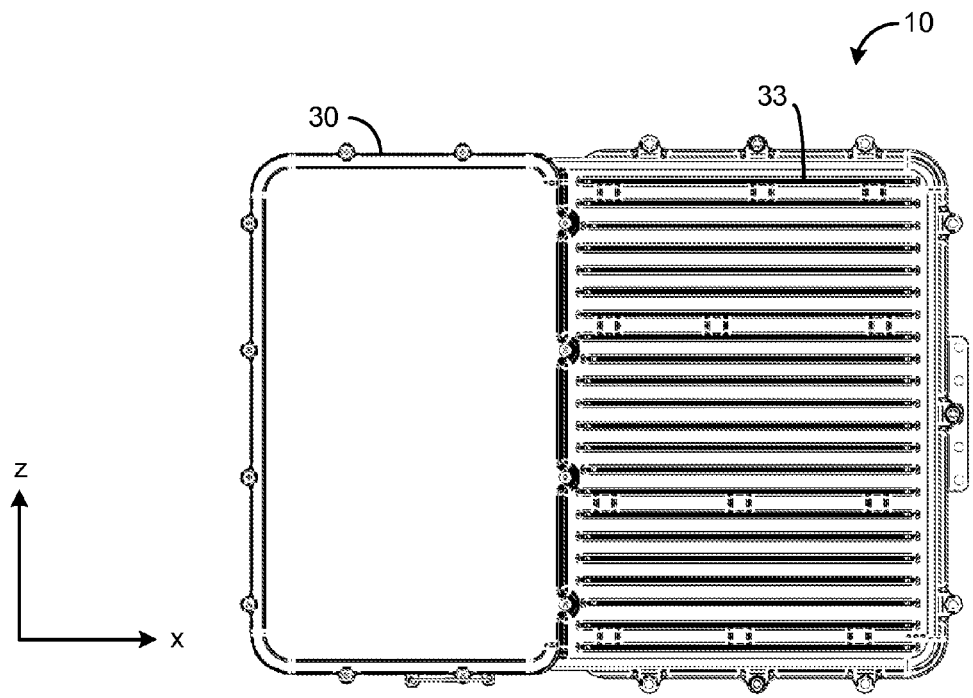
FIG. 9 depicts the NAD of FIG. 7 when the NAD is oriented improperly.

FIG. 9 depicts a front view of the NAD 10 when it is has been improperly oriented. In this regard, the enclosure 30 of FIG. 9 is rotated clockwise approximately 90 degrees about the y-axis relative to the enclosure 30 shown by FIG. 8. In such example, the fins 33 are perpendicular to the z-axis. As noted above, air heated by the enclosure 30 tends to flow in the positive z-direction. However, the fins 33, which are now oriented in a direction perpendicular to the z-direction, impede the flow of heated air thereby reducing the rate at which heat can be dissipated from the enclosure 30. This increases the temperature inside the enclosure 30. Further, if the fins 33 are contacting an object, such as a wall on which the enclosure 30 is mounted, the heated air within the channels 36 on the side contacting the object is effectively trapped within the channels 36 except for the small amounts of air that egress at the channel ends.

Figure 10:
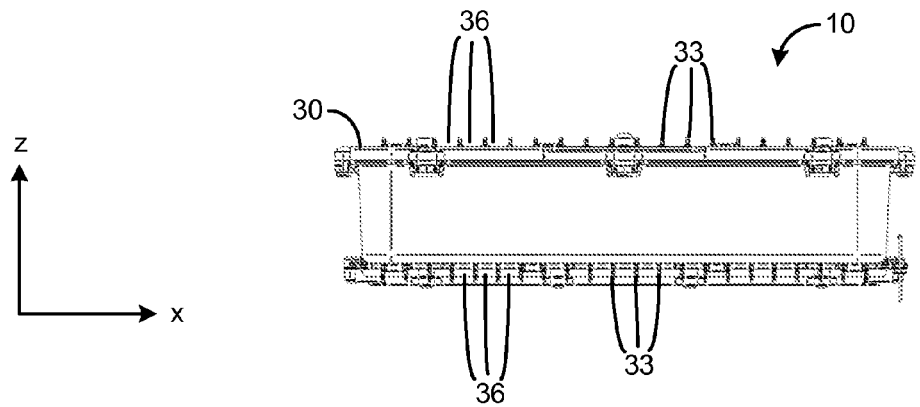
FIG. 10 depicts the NAD of FIG. 7 when the NAD is oriented improperly.

FIG. 10 depicts another improper orientation of the NAD 10. In this regard, the enclosure 30 of FIG. 10 is rotated approximately 90 degrees about the x-axis relative to the enclosure 30 shown by FIG. 8. In such example, the fins 33 are perpendicular to the z-axis. As noted above, air heated by the enclosure 30 tends to flow in the positive z-direction. Heated air in the channels 36 on the upper surface of enclosure 30 shown by FIG. 10 dissipates away from the enclosure 30 by flowing in the positive z-direction. However, air in the channels 36 on the bottom surface of the enclosure 30 shown by FIG. 10 is prevented by the body of the enclosure 30 from flowing in the positive z-direction effectively trapping the heated air in the channels 36 except for the small amounts of air that can egress at the channel ends. This increases the temperature inside the enclosure 30.

For illustrative purposes, assume that the enclosure 30 is improperly oriented as shown by FIG. 9. In this regard, the enclosure 30 is tilted approximately 90 degrees about the y-axis relative to the desired orientation shown by FIG. 8. Further assume that the orientation data 17 indicates that up to 15 degrees of tilt is allowed about the y-axis. Also, assume that the component 19 comprises a visual indicator 21 (FIG. 3), such as an LED, that is illuminated when the orientation of the enclosure 30 is deemed to be improper.

Initially, a technician installs the NAD 10, and the NAD 10 is powered up. Upon power up, the orientation system 12 is configured to continuously sense the orientation of the NAD 10 and determine whether the orientation is proper, as shown by blocks 100, 102, and 104 of FIG. 11. In this regard, the orientation sensor 14 senses the degree of tilt about each axis. If the NAD 10 is oriented properly, then the orientation sensor 14 should detect no degree of tilt about any axis. However, in the instant example, the orientation sensor 14 senses approximately 90 degrees of tilt about the y-axis.

The control logic 14 compares the tilt measurement for each axis to the corresponding range indicated by the orientation data 17. As described above, the orientation data 17 indicates that no more than 15 degrees of tilt is acceptable for the measured tilt about the y-axis. The ranges for measured tilts about the other axes may be the same or different than the range for the measured tilt about the y-axis. In the current example, the measured tilt about the y-axis is outside of the acceptable range, and the control logic 15 therefore determines that the enclosure's orientation is improper. In response, the control logic 15 asserts the notification signal transmitted to the visual indicator 21 indicating that the enclosure's orientation is deemed to be improper, as shown by block 106 of FIG. 11. Such notification signal is received by the visual indicator 21, which emits light in response to the notification signal.

Upon seeing the light, a user may be aware of the enclosure's improper orientation and then begin adjusting such orientation. For example, assume that the user rotates the enclosure 30 about the y-axis such that the enclosure 30 is oriented as shown by FIG. 7. Once the enclosure is moved into a position such that the tilts measured by the orientation sensor 14 are within the acceptable ranges, as indicated by the orientation data 17, the control logic 15 deasserts the notification signal, as shown by block 107 of FIG. 11, and the visual indicator 21 stops emitting light. Accordingly by viewing the visual indicator 21, the user can determine when the enclosure 30 is oriented in a manner that is deemed proper by the control logic 15.

Note that a variety of actions may occur in response to a detection of an improper orientation. As an example, a user may be warned of the improper orientation, as described above. In addition to or in lieu of such warning, the control logic 15 may be configured to change the operation of the NAD 10 in an effort to compensate for the improper orientation. As an example, as will be described in more detail below, if the NAD 10 is equipped with a fan to help cool the electronic circuits within the enclosure 30, the fan may be dynamically controlled based on the notification signal provided by the control logic 15. It is also possible for the control logic 15 to transition the NAD 10 into a reduced functionality mode, referred to hereafter as "limp mode," by disabling certain functions (e.g., removing power or service from one or more components) of the NAD 10 in response to a detection of an improper orientation. By transitioning the NAD 10 to such a limp mode, the electronic circuits within the enclosure 30 may produce less heat helping to keep the temperatures within the enclosure 30 in a more desirable range until the orientation of the enclosure 30 can be corrected. If desired, the transition to the limp mode may be triggered by assertion of the notification signal, though other techniques for transitioning the NAD 10 to the limp mode are possible.

Figure 12:
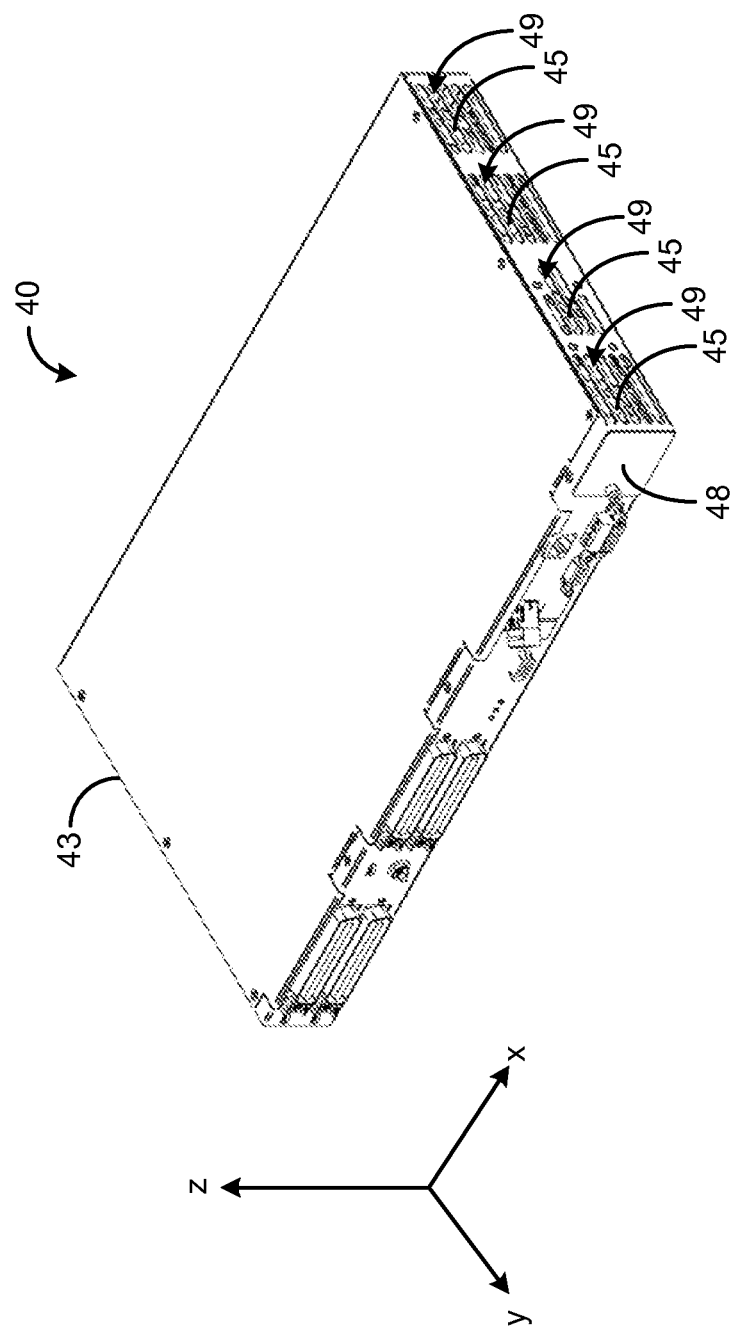
FIG. 12 depicts another exemplary embodiment of an NAD, such as is depicted by FIG. 2.

FIG. 12 depicts another exemplary embodiment of an NAD 40. The NAD 40 comprises an enclosure 43 having electronic circuits and at least one fan 45 positioned on a fan module 48 within the enclosure 43. In the exemplary embodiment shown by FIG. 12, the fan module 48 has four fans 45, each of which is visible through a respective set of vent holes 49. Note that vent holes similar to the ones shown by FIG. 12 are at the opposite end of the enclosure 43 so that air may enter through one end of the enclosure 43 and exit the other end.

Each fan 45 provides active cooling for the electronic circuits within the enclosure 43 by causing air to flow across the circuits and carry heat from the circuits out of the enclosure 43 thereby maintaining a more desirable operating temperature within the enclosure 43. Note that, in some embodiments, the fans 45 may operate at varying speeds depending on head pressure against the fans 45 and the desired airflow rate within the enclosure 43. In this regard, it is generally desirable to operate each fan 45 at the lowest speed that sufficiently cools the electronics in order to reduce noise and power consumption of the fan 45 and to extend the life of the fan 45. Thus, as the head pressure against the fan 45 increases, it may be desirable to increase the electrical power to the fan 45 (i.e., speed up the fan 45) in order to maintain a desired airflow rate for cooling the circuits within the enclosure 43. This results in increased power consumption by the fan 45, and, in some cases, may result in overheating of the NAD 40 when the fan 45 cannot maintain the desired airflow rate.

As set forth above, buoyant airflow due to natural convection occurs in the vertical direction (e.g. positive z-direction). Thus, it is desirable for the orientations of the fans 45 to be such that airflow from each fan 45 does not oppose buoyant airflow. In this regard, if the airflow from a fan 45 opposes buoyant airflow due to an improper orientation, the fan 45 may be unable to achieve the desired flow rate to sufficiently cool the electronics. In addition, if the fan 45 is designed to adjust its speed based on head pressure as described above, the fan 45 will operate at a higher electrical power than otherwise would be required in order to overcome the head pressure caused by the opposing buoyant airflow. Thus, orienting the NAD 40 such that the fans 45 blow air in the negative z-direction causes the fans 45 to oppose buoyant airflow resulting in less efficient cooling.

Like the NAD 10 of FIG. 7, the NAD 40 of FIG. 12 comprises an orientation system 12 (FIG. 2). The system 12 has an orientation sensor 14 (FIG. 2) positioned within the enclosure 43 or is otherwise coupled to the enclosure 43. The orientation sensor 14 detects the orientation of the enclosure 43 and, hence, the orientation of the fans 45 that are within the enclosure 43, and the control logic 15 determines whether the detected orientation is deemed to be proper, as indicated by the orientation data 17. For illustrative purposes, it will be assumed hereafter that the orientation sensor 14 makes a plurality of tilt measurements to define the orientation of the enclosure 43, but it should be emphasized that other types of measurements may be used in other embodiments.

In one exemplary embodiment, the range of acceptable tilt measurements is such that the orientation is deemed to be proper if the direction of airflows from the fans 45 does not oppose buoyant airflow. That is, the orientation is deemed proper if the enclosure 43 is positioned such that no component of the airflow induced by each fan 45 is in the negative z-direction. Thus, the fans 45 may be oriented such that their airflows travel in the positive or negative x-direction, the positive or negative y-direction, the positive z-direction, and/or a combination of such directions because airflow in the foregoing directions would not oppose buoyant airflow. In the embodiment depicted by FIG. 12, the fans 45 induce airflows that travel in the positive or negative x-direction, depending on the direction of fan-blade rotation. Thus, the orientation shown by FIG. 12 would be deemed to be proper by the control logic 15.

Figure 13:
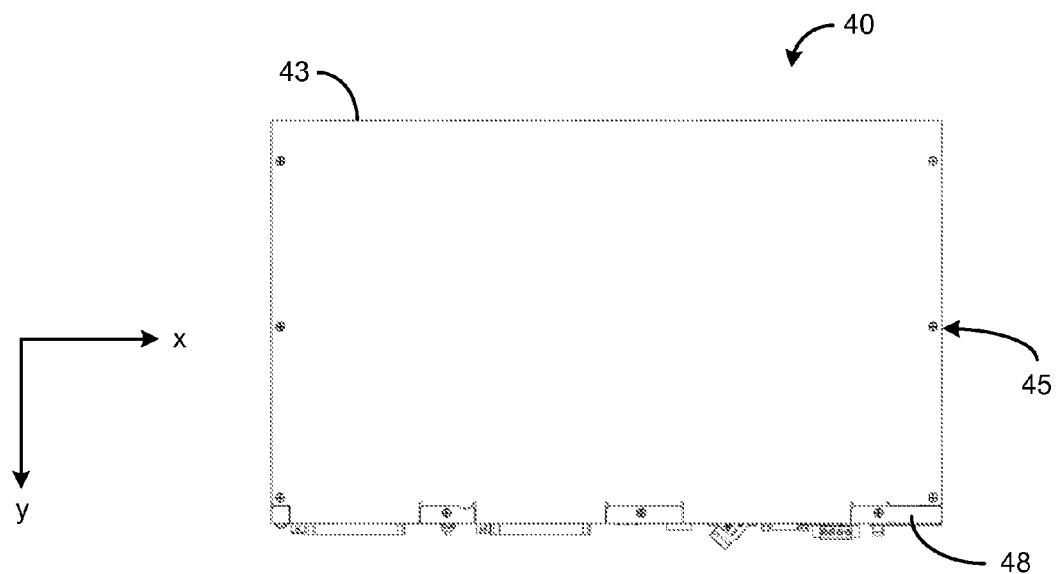
FIG. 13 depicts the NAD of FIG. 12 when the NAD is oriented properly.

FIG. 13 depicts a top view of the NAD 40 of FIG. 12. As shown by FIG. 13, the fan module 48 is positioned at one end of the enclosure 43. The fans 45 pull cool air in through vent holes 49 at one end of the enclosure 43, across the electric circuits within the enclosure 43, and out through vent holes 49 at the other end of the enclosure 43. The air is heated as it passes through the enclosure 43 such that expulsion of the air from the enclosure 43 removes heat from within the enclosure 43 and helps to keep the temperatures within the enclosure 43 low. Airflows from the fans 45 travel in the positive or negative x-direction, depending on the direction of fan-blade rotation, but such airflows do not travel in the negative z-direction. Accordingly, heat can be removed from the enclosure 43 without requiring the fans 45 to overcome the head pressure associated with buoyant airflow.

Figure 14:
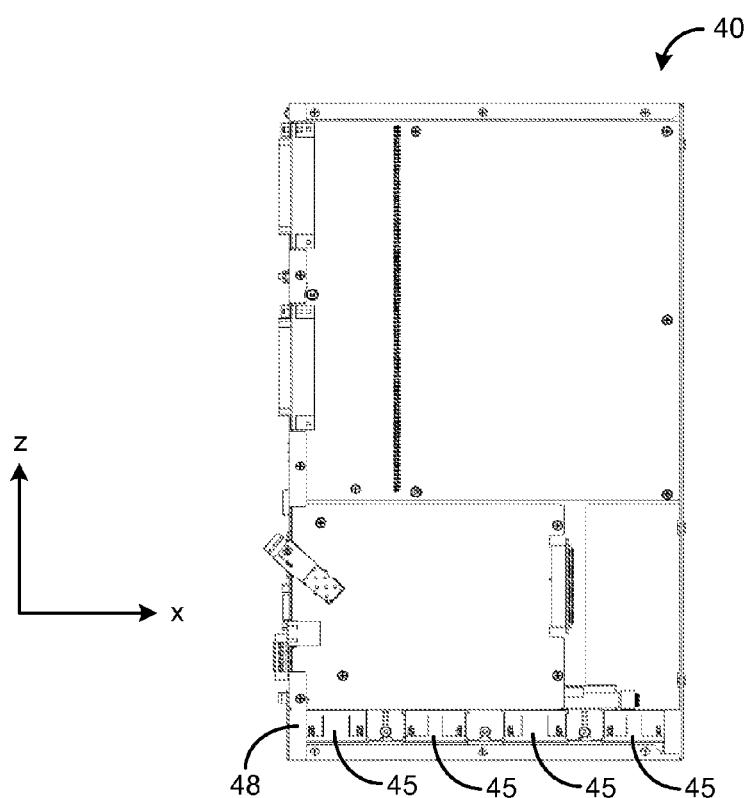
FIG. 14 depicts the NAD of FIG. 12 after a cover of an enclosure for the NAD has been removed for illustrative purposes.

FIG. 14 depicts a top view of the NAD 40 of FIG. 12 with a panel of the enclosure 43 removed for illustrative purpose to show components within the enclosure 43. The enclosure of FIG. 14 is rotated approximately 90 degrees about the x and y axes. As shown by FIG. 14, the fans 45 are positioned at the lower end of the NAD 40. In one embodiment, the direction of fan-blade rotation is such that the fans 45 induce airflows that travel in the positive z-direction. In such embodiment, the airflows from the fans 45 travel in the same direction (e.g. the positive z-direction) as buoyant airflow thereby aiding buoyant airflow in cooling the circuits within the NAD 40. Thus, the orientation of the NAD 40 for such embodiment is acceptable.

However, if the direction of fan-blade rotation is such that the fans 45 induce airflows that travel in the negative z-direction, then the airflows from the fans 45 travel in a direction opposite to the direction of buoyant airflow. Thus, the airflows from the fans 45 oppose buoyant airflow thereby decreasing the airflow rate for a given blade speed. In such an embodiment the orientation of the NAD 40 is deemed to be improper.

Figure 15:
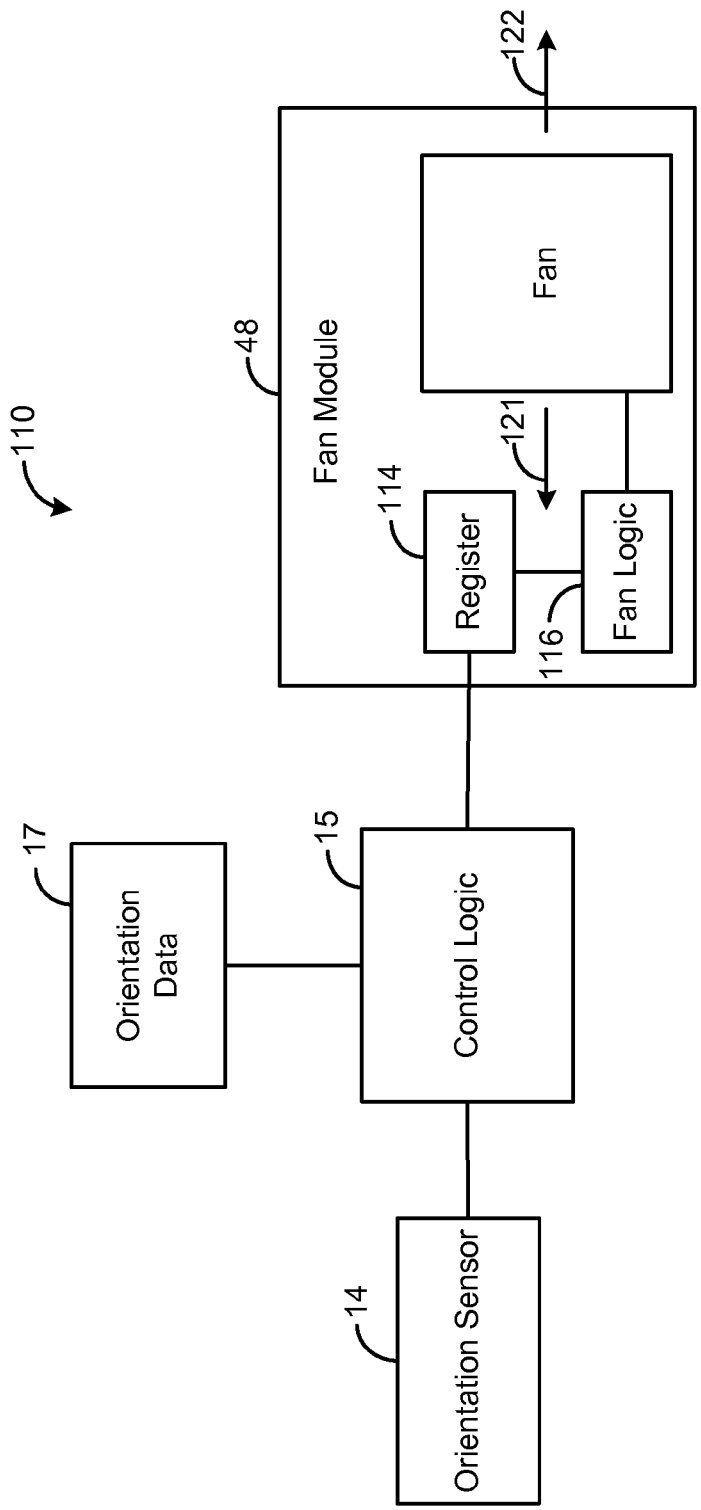
FIG. 15 is a block diagram illustrating an exemplary embodiment of an NAD, such as is depicted by FIG. 12.

Note that the fan-blade rotation may be fixed such that the control logic 15 does not need to dynamically determine airflow direction in deciding whether the orientation of the NAD 40 is proper. In another embodiment, the direction of fan-blade rotation is reversible. As an example, the direction of fan-blade rotation may be controllable by the logic 15. In one exemplary embodiment, the fan module 48 has a register (not shown by FIG. 14) storing a value for controlling the direction of fan-blade rotation. By reading such value, the direction of fan-blade rotation can be determined, and the direction of fan-blade rotation can be changed by updating the value. FIG. 15 depicts such an exemplary embodiment.

In this regard, as shown by FIG. 15, an NAD 110 comprises an orientation sensor 14, control logic 15, and orientation data 17, as described above for the embodiment depicted by FIG. 2. However, the NAD 110 further comprises a register 114, fan logic 116, and a fan module 48 having at least one fan 45. In one exemplary embodiment, the fan logic 116 is implemented in hardware, but the fan logic 116 can be implemented in hardware, software, firmware, or any combination thereof.

The fan logic 116 is configured to control the direction of fan-blade rotation based on a control setting stored in the register 114. As an example, the control setting in the register 114 may be a one bit value. The fan control logic 116 is configured to read the control setting and control the direction of rotation of the fan blades such that they induce an airflow in the direction indicated by reference arrow 121 if the control setting is asserted. However, if the control setting is deasserted, the fan logic 116 is configured to cause the fan blades to rotate in the opposite direction so that they induce airflow in the direction indicated by reference arrow 122, which is opposite to the direction indicated by reference arrow 121.

The control logic 15 is configured to control the value of the control setting in the register 114 based on the orientation sensor 14 and the orientation data 17 so that the fan 45 blows air in a desired direction in an effort to ensure that the direction of airflow from the fan 45 is optimized for cooling the NAD 110. As an example, assume that the control setting in the register 114 is deasserted by default such that the fan 45 ordinarily blows air in the direction 122. If the NAD 110 is installed in a proper orientation, then airflow induced by the fan 45 in the direction 122 does not counteract buoyant airflow. However, there is a range of orientation angles for which the NAD 110 is improperly installed such that airflow in the direction 122 does counteract buoyant airflow. As an example, if the NAD 110 is installed such that gravitational pull is in the direction 122 causing hot air to flow in the direction 121, then airflow in the direction 122 would directly oppose buoyant airflow reducing the fan's effect in cooling the NAD 110.

The orientation data 17 indicates a range of orientation angles such that if the orientation angle sensed by the sensor 14 is within the indicated range, then the orientation of the NAD 110 is deemed improper. In the instant example, the range is defined such that airflow in the direction 122 would oppose, at least to an extent, buoyant airflow if the sensed orientation angle is within the indicated range. Thus, by determining whether the sensed orientation angle is within the range indicated by the orientation data 17, the control logic 15 effectively determines the NAD's orientation relative to buoyant airflow.

Figure 11:
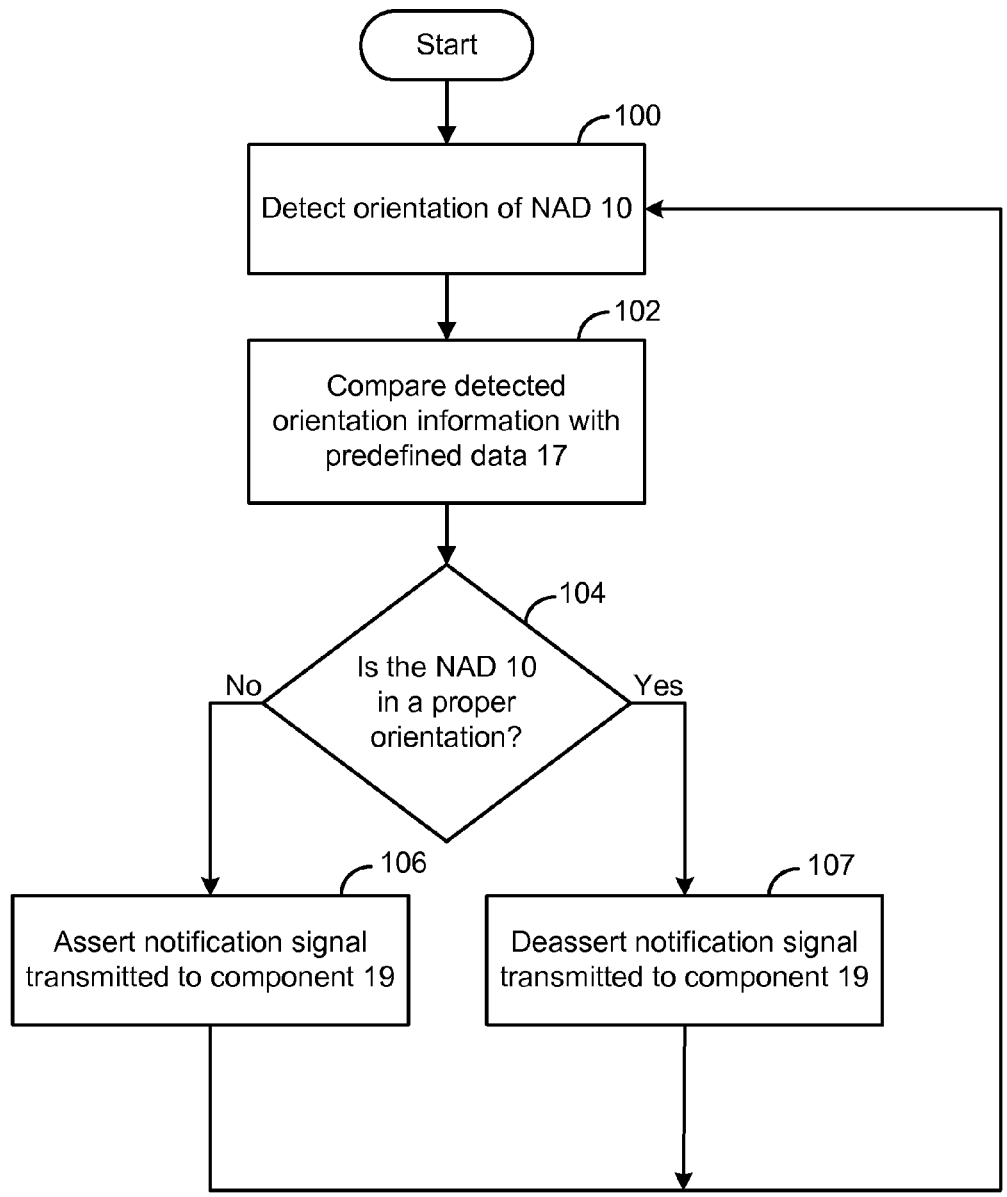
FIG. 11 is a flowchart depicting an exemplary method of indicating an orientation status of an NAD having a cooling system.

In the instant example, the orientation sensor 14 senses the orientation angle of the NAD 110 and provides such angle to the control logic 15, which compares the angle to the orientation data 17, as shown by blocks 100 and 102 of FIG. 11. If the orientation angle is outside of the improper orientation range indicated by the data 17, then the control logic 15 determines that the orientation of the NAD 110 is proper and thus deasserts the notification signal that is provided to the register 114, as shown by blocks 104 and 107 of FIG. 11. The register 114 is configured to deassert the control setting for the fan 45 in response to a deasserted notification signal from the control logic 15. Therefore, in the instant case, the fan 45 induces an airflow in the direction 121.

However, assume that the NAD 110 is improperly installed such that the airflow from the fan 45, if traveling in the direction 122, would oppose buoyant airflow. In such case, the orientation angle sensed by the sensor 14 is within the improper range indicated by the data 117. Thus, the control logic 15 asserts the notification signal provided to the register 114, as shown by blocks 104 and 106. In response to an asserted notification signal, the register 114 is configured to assert the control setting for the fan 45. Thus, the fan logic 116, based on the control setting, is configured to control the fan 45 such that it blows in the direction 121 instead of the direction 122. In such case, the direction of the airflow induced by the fan 45 is dynamically controlled in order to prevent such airflow from opposing buoyant airflow thereby helping the fan 45 to better cool the NAD 110.

In other embodiments, other techniques for controlling the airflow direction of the fan 45 are possible. As an example, to change the airflow direction of the fan 45, the fan module 48 may be manually removed from the enclosure 43 and re-inserted with the fan blades facing the opposite direction so that they rotate in the same direction relative to the fan module 48 but in the opposite direction relative to the enclosure 43. In such embodiment, the polarity of the terminals from which the fans 45 draw power are reversed when the module 48 is re-inserted relative to the polarity of the terminals prior to removal, and the orientation of the fan module 48 and, hence, fan-blade rotation can be sensed by sensing the polarity of such terminals.

Figure 16:
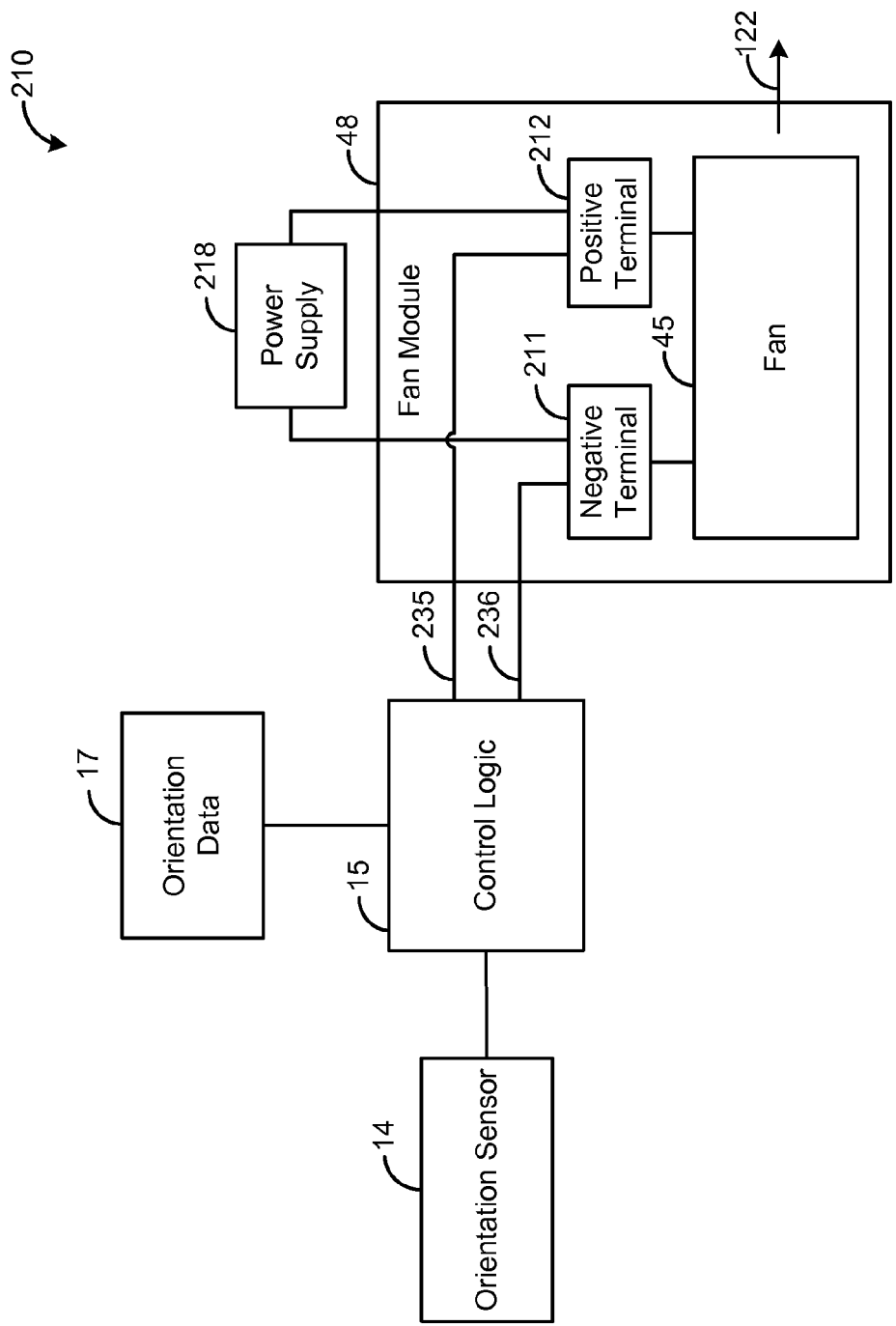
FIG. 16 is a block diagram illustrating an exemplary embodiment of an NAD, such as is depicted by FIG. 12.

In such embodiments that allow for different fan orientations, the decision about whether the NAD 110 has been properly installed is based on the orientation sensed by the sensor 14 as well as an orientation sensed for the fan 45. For example, refer to FIG. 16, which depicts an exemplary embodiment of an NAD 210. As shown by FIG. 16, the NAD 210 comprises an orientation sensor 14, control logic 15, and orientation data 17. The orientation data 17, like for the embodiment depicted by FIG. 15, defines a range (referred to hereafter as the "predefined range") of orientation angles that are deemed to be improper, assuming that the airflow from the fan 45 is in the direction 122. However, such predefined range of orientation angles would be deemed to be proper if the airflow from the fan 45 is in the opposite direction 121. Thus, before making a determination whether the sensed orientation is proper, the control logic 15 first determines the fan's orientation relative to the enclosure of the NAD 210.

There are various techniques that could be used to determine the fan's orientation. In one exemplary embodiment, the orientation of terminals 211 and 212 is used to determine the fan's orientation. In this regard, the terminals 211 and 212 are coupled to a power supply 218, which is used to provide electrical power through the terminals 211 and 212 to the fan 45. One terminal 211, referred to as the "negative terminal," is coupled to the negative terminal (not specifically shown) of the power supply 218 when the fan module 48 is orientated as shown such that airflow induced by the fan 45 flows in the direction 122. The other terminal 212, referred to as the "positive terminal," is coupled to the positive terminal (not specifically shown) of the power supply 218 when the fan module 48 is oriented as shown. As shown by FIG. 16, the control logic 15 is coupled to the terminals 211 and 212 via connections 235 and 236, respectively, and senses the orientation of the terminals 211 and 212 based on the voltage between the terminals 211 and 212.

For example, when the module 48 is oriented as shown, the control logic 15 determines that the orientation of the NAD 210 is proper unless the sensed orientation angle indicated by the orientation sensor 14 is within the predefined range indicated by the orientation data 17. If the sensed orientation angle is within the indicated range, the control logic 15 deems the NAD's orientation to be improper and asserts the notification signal provided by it, as described above for the embodiment shown by FIG. 15. In one exemplary embodiment, the control logic 15 is coupled to a visual indicator 21, and an asserted notification signal activates the indicator 21 so that it emits light thereby providing a warning. Other types of components may be controlled by the control logic 15 based on the NAD's orientation in other embodiments. In response to the improper orientation notification from the visual indicator 21, a user may remove the fan module 48 and re-insert the module 48 in a reverse orientation so that the module 48 is oriented as shown by FIG. 17.

Figure 17:
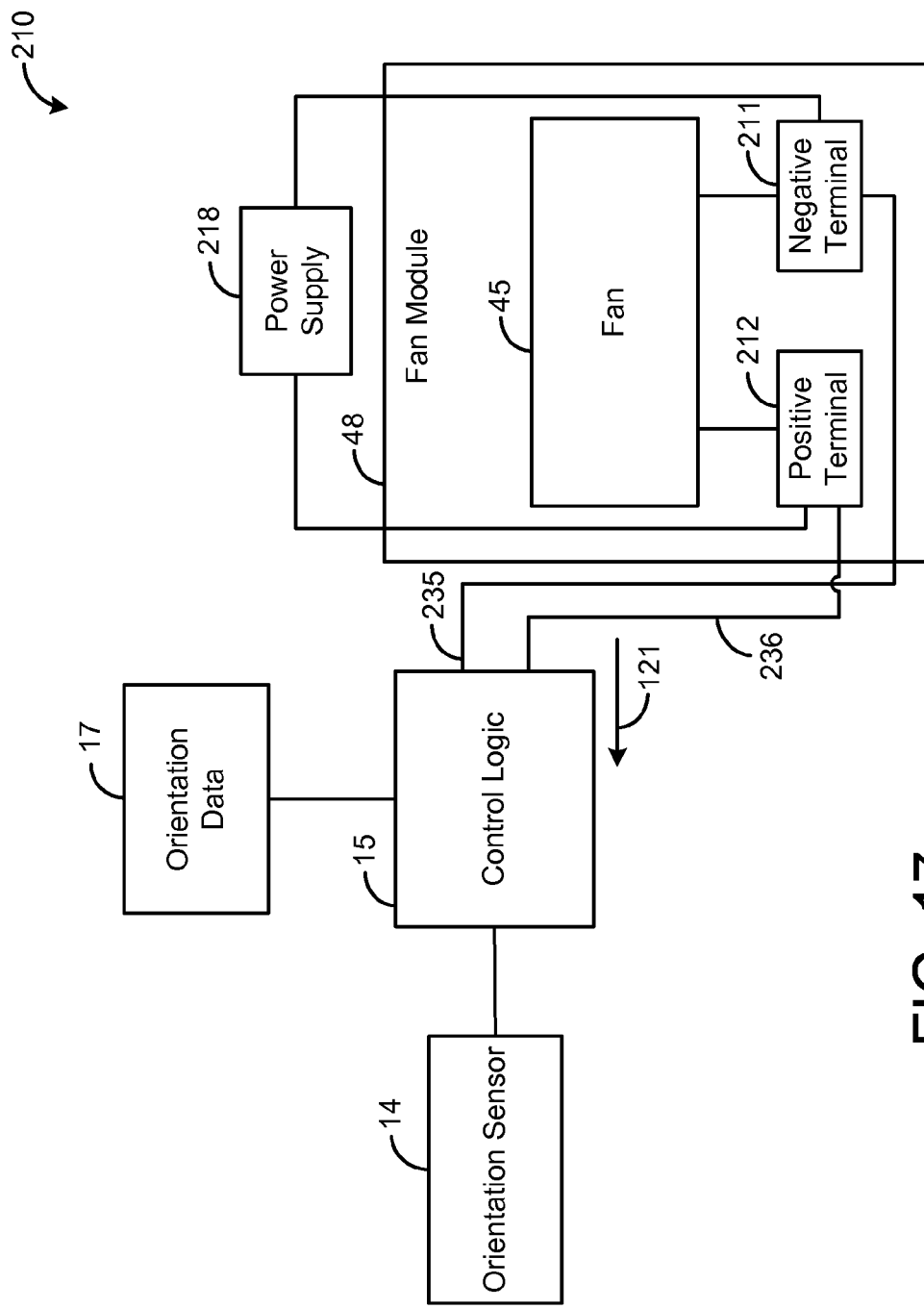
FIG. 17 is a block diagram illustrating the NAD of FIG. 16 after an orientation of a fan module has been reversed.

In the orientation shown by FIG. 17, the direction of the fan 45 is reversed so that it blows in the direction 121, which is opposite to the direction 122 of fan airflow in the embodiment of FIG. 16. In addition, the connectivity to the terminals 211 and 212 is also reversed. That is, connection 235 is now coupled to the negative terminal 211, and the connection 236 is now coupled to the positive terminal. Thus, the control logic 15 is able to detect the changed fan-module orientation based on the changed sign of the voltage across the terminals 211 and 212.

When the control logic 15 senses the fan-module orientation shown by FIG. 17, the control logic 15 no longer deems the NAD orientation to be improper if the sensed orientation angle from the sensor 14 is within the predefined range indicated by the data 17. Instead, the control logic 15 deems the NAD's orientation to be proper if the sensed angle is within the indicated range and thus deasserts the notification signal. In such case, no warning is provided by the visual indicator 21. If the sensed angle is outside of the indicated range, the control logic 15 deems the NAD's orientation to be improper and thus asserts the notification signal, and the visual indicator 21 provides a warning. Thus, the ranges of orientation angles deemed to be proper is dependent on the sensed orientation of the fan module 48.

In other embodiments, yet other techniques for making decisions about the orientation status of the NAD based on the direction of fan airflow are possible. Further, in various embodiments described above, an orientation system is described within the context of a NAD, such as a DSLAM. However, the techniques and configurations described herein may be used for other electrical equipment, such as computers, for which the equipment's orientation affects the performance of a cooling system designed for such equipment.

The invention claimed is:

1. An apparatus having an active cooling system, comprising:
   electronic circuits;
   an enclosure for housing the electronic circuits;
   a fan for blowing air through the enclosure;
   an orientation sensor for sensing a parameter indicative of an orientation of the fan; and
   logic configured to determine, based on the parameter sensed by the orientation sensor, whether a direction of an airflow induced by the fan is within a predefined range of a direction of buoyant airflow, the logic further configured to transmit a notification signal indicating whether the direction of the airflow induced by the fan is within the predefined range.

2. The apparatus of claim 1, wherein the apparatus is a network access device coupled to a subscriber line of a communication network.

3. The apparatus of claim 1, further comprising a visual indicator configured to emit a visual warning based on the notification signal.

4. The apparatus of claim 1, further comprising an audible indicator configured to emit an audible warning based on the notification signal.

5. The apparatus of claim 1, further comprising a communication device configured to transmit a warning message based on the notification signal.

6. The apparatus of claim 1, further comprising a switch configured to change state based on the notification signal.

7. The apparatus of claim 1, wherein the logic is configured to disable at least one function of the apparatus based on the notification signal, thereby reducing power consumption and heat within the enclosure.

8. The apparatus of claim 1, wherein the logic is configured to control the fan based on the notification signal.

9. The apparatus of claim 1, wherein the notification signal indicates whether the fan is oriented in a manner such that the airflow induced by the fan opposes the buoyant airflow.

10. The apparatus of claim 1, wherein the logic is configured to determine the direction of the airflow induced by the fan.

11. The apparatus of claim 10, wherein the logic is configured to compare the direction of the buoyant airflow and the determined direction of the airflow induced by the fan.

12. An apparatus having an active cooling system, comprising:
   electronic circuits;
   an enclosure for housing the electronic circuits;
   a fan for blowing air through the enclosure;
   an orientation sensor for sensing a parameter indicative of an orientation of the fan; and
   logic configured to indicate, based on the parameter sensed by the orientation sensor, whether the fan is oriented in a manner such that an airflow induced by the fan opposes buoyant airflow.

13. The apparatus of claim 12, wherein the logic is configured to provide a warning to a user if the airflow induced by the fan opposes the buoyant airflow.

14. The apparatus of claim 12, wherein the logic is configured to disable at least one function of the apparatus based on the orientation sensor, thereby reducing power consumption and heat within the enclosure.

15. The apparatus of claim 12, wherein the logic is configured to control the fan based on the parameter sensed by the orientation sensor.

16. The apparatus of claim 12, wherein the logic is configured to determine the direction of the airflow induced by the fan.

17. A method, comprising:
   providing an apparatus having electronic circuits housed by an enclosure;
   blowing air through the enclosure via a fan;
   sensing an orientation of the fan relative to a direction of buoyant airflow; and
   indicating, based on the sensing, whether an airflow induced by the fan is within a predefined range of the direction of the buoyant airflow.

18. The method of claim 17, wherein the indicating comprises warning a user of an improper orientation of the fan.

19. The method of claim 17, further comprising disabling at least one function of the apparatus based on the indicating.

20. The method of claim 17, further comprising controlling the fan based on the indicating.

21. The apparatus of claim 1, wherein the orientation sensor is configured to sense an angle, and wherein the logic is configured to determine, based on the sensed angle, whether the direction of the airflow induced by the fan is within the predefined range.

22. The apparatus of claim 12, wherein the orientation sensor is configured to sense an angle, and wherein the logic is configured to indicate, based on the sensed angle, whether the fan is oriented in the manner such that the airflow induced by the fan opposes buoyant airflow.

23. The method of claim 17, wherein the sensing comprises sensing an angle of the fan.

\* \* \* \* \*